(12) United States Patent
Takabe et al.

(10) Patent No.: US 11,571,893 B2
(45) Date of Patent: Feb. 7, 2023

(54) LIQUID EJECTING HEAD AND LIQUID EJECTING APPARATUS

(71) Applicant: SEIKO EPSON CORPORATION, Tokyo (JP)

(72) Inventors: Motoki Takabe, Shiojiri (JP); Shohei Mizuta, Matsumoto (JP); Yu Shiozawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 38 days.

(21) Appl. No.: 17/304,882

(22) Filed: Jun. 28, 2021

(65) Prior Publication Data
US 2021/0402772 A1    Dec. 30, 2021

(30) Foreign Application Priority Data

Jun. 30, 2020 (JP) .............................. JP2020-112260
Apr. 9, 2021 (JP) .............................. JP2021-066370

(51) Int. Cl.
*B41J 2/14* (2006.01)
*B41J 2/045* (2006.01)
*H01L 41/04* (2006.01)

(52) U.S. Cl.
CPC ........ *B41J 2/14201* (2013.01); *B41J 2/04581* (2013.01); *B41J 2/1433* (2013.01); *H01L 41/042* (2013.01)

(58) Field of Classification Search
CPC ................ B41J 2/14201; B41J 2/04581; B41J 2/1433; B41J 2002/14241; B41J 2002/14419; B41J 2002/14491; B41J 2202/12; B41J 2/14233; B41J 2002/14362; H01L 41/042
See application file for complete search history.

(56) References Cited

U.S. PATENT DOCUMENTS

2016/0089905 A1\* 3/2016 Wakabayashi ....... B41J 11/0045
                                                                269/86
2018/0264830 A1    9/2018 Tomimatsu

FOREIGN PATENT DOCUMENTS

JP        2018-153926 A     10/2018

OTHER PUBLICATIONS

IP.com search (Year: 2022).*

\* cited by examiner

*Primary Examiner* — Lisa Solomon
(74) *Attorney, Agent, or Firm* — Workman Nydegger

(57) ABSTRACT

In this liquid ejecting head, the pressure chamber extends in a second direction crossing a first direction, the first direction being a direction from the pressure chamber to the nozzle. The pressure chamber and the absorbing chamber are disposed at a same position in the first direction and next to each other in the second direction. The actuator is disposed on an opposite side in the first direction with respect to the pressure chamber. The absorption member is disposed on the opposite side in the first direction with respect to the absorbing chamber, the absorption member including at least part of members constituting the actuator.

20 Claims, 11 Drawing Sheets

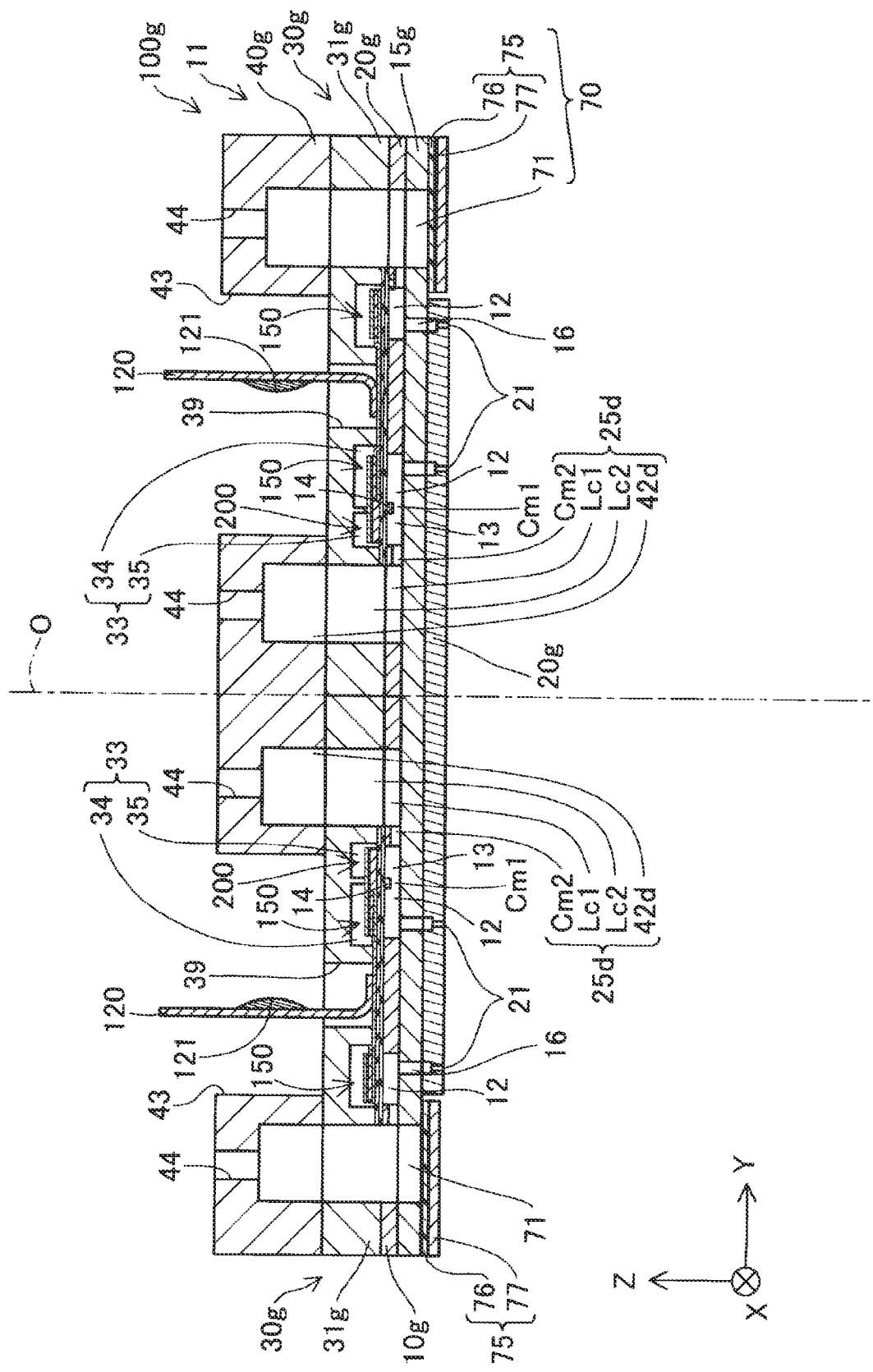

LIQUID EJECTING HEAD AND LIQUID EJECTING APPARATUS

The present application is based on, and claims priority from JP Application Serial Number 2020-112260, filed Jun. 30, 2020, and JP Application Serial Number 2021-066370, filed Apr. 9, 2021, the disclosure of which is hereby incorporated by reference herein in its entirety.

BACKGROUND

1. Technical Field

The present disclosure relates to liquid ejecting heads and liquid ejecting apparatuses.

2. Related Art

JP-A-2018-153926 discloses a liquid ejecting head including a compliance substrate serving as a liquid ejecting head provided in a liquid ejecting apparatus, such as a printer. This liquid ejecting head absorbs a pressure fluctuation due to liquid using the compliance substrate to enhance stability in liquid ejection from the liquid ejecting head.

The compliance substrate disclosed in JP-A-2018-153926 is made of a material different from the materials of a piezoelectric element and a vibration plate, which are other members constituting the liquid ejecting head. This may increase the number of components constituting the liquid ejecting head and the kinds of materials forming the components, thereby complicating the manufacturing process.

SUMMARY

According to a first aspect of the present disclosure, a liquid ejecting head is provided which includes a nozzle that ejects liquid, an actuator including a piezoelectric element and a vibration plate that is vibrated by driving of the piezoelectric element, a pressure chamber in which the liquid flows and in which a pressure is applied to the liquid by vibration of the vibration plate, an absorbing chamber in the liquid flows, the absorbing chamber absorbing the vibration of the liquid propagated from the pressure chamber, and an absorption member. In the liquid ejecting head, the pressure chamber extends in a second direction crossing a first direction, the first direction being a direction from the pressure chamber to the nozzle. The pressure chamber and the absorbing chamber are disposed at a same position in the first direction and next to each other in the second direction. The actuator is disposed on an opposite side in the first direction with respect to the pressure chamber. The absorption member is disposed on the opposite side in the first direction with respect to the absorbing chamber, the absorption member including at least part of members constituting the actuator.

According to a second aspect of the present disclosure, a liquid ejecting apparatus is provided. The liquid ejecting apparatus includes the liquid ejecting head according to the first aspect and a control unit that controls an ejecting operation from the liquid ejecting head.

BRIEF DESCRIPTION OF THE DRAWINGS

FIG. 11 is a cross-sectional view of a liquid ejecting head according to a seventh embodiment.

DESCRIPTION OF EXEMPLARY EMBODIMENTS

A. First Embodiment

Figure 1:
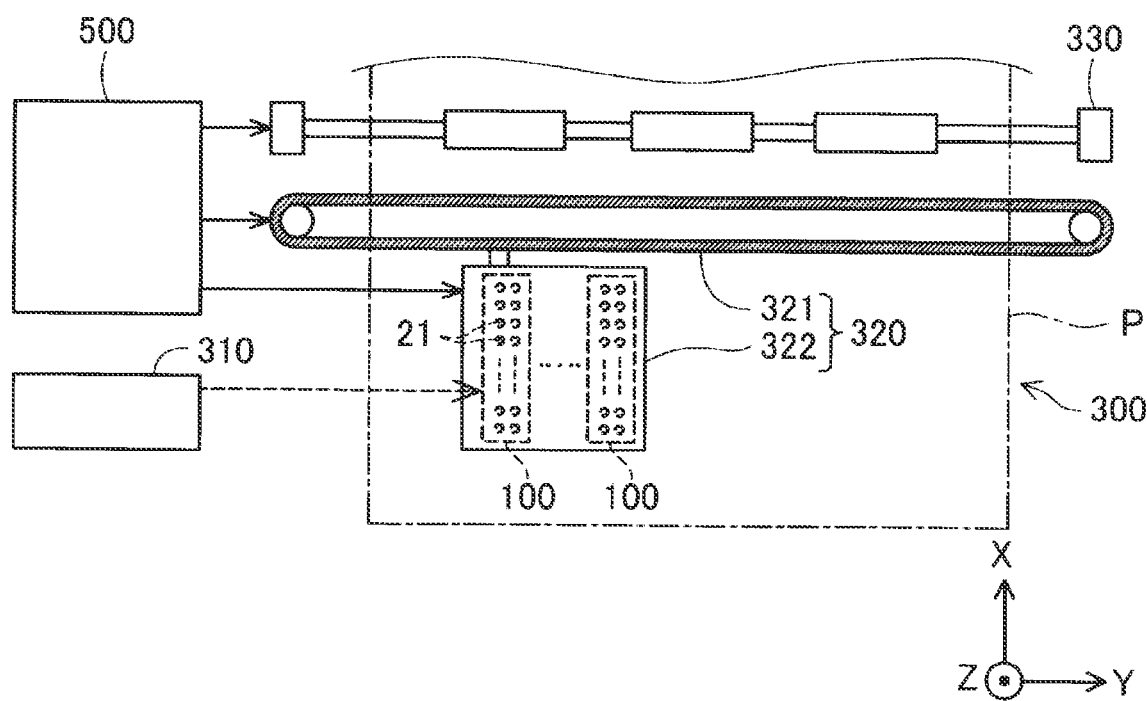
FIG. 1 is a schematic diagram illustrating, in outline, the configuration of a liquid ejecting apparatus including a liquid ejecting head which is a first embodiment of the present disclosure.

FIG. 1 is a schematic diagram illustrating, in outline, the configuration of a liquid ejecting apparatus 300 including a liquid ejecting head 100 which is a first embodiment of the present disclosure. FIG. 1 shows arrows in the X, the Y, and the Z directions orthogonal to one another. The X, the Y, and the Z directions are directions along X-axis, Y-axis, and Z-axis, which are three spatial axes orthogonal to one another, and include one direction along the X-axis, the Y-axis, the Z-axis and the opposite directions thereof, respectively. Specifically, positive directions along the X-axis, the Y-axis, and the Z-axis are +X direction, +Y direction, and +Z direction, respectively, and negative directions along the X-axis, the Y-axis, and the Z-axis are −X direction, −Y direction, and −Z direction, respectively. In FIG. 1, the X-axis and the Y-axis are axes along the horizontal surface, and the Z-axis is an axis along the vertical line. Thus, in this embodiment, the −Z direction is the direction of gravitational force. Also in the other drawings, the arrows along the X, the Y, and the Z directions are shown as appropriate. The X, the Y, and the Z directions in FIG. 1 and the X, the Y, and the Z directions in the other drawings indicate the same directions. In this specification, "orthogonal" includes the range of 90°±10°.

The liquid ejecting apparatus 300 is an ink jet printer that prints an image on a medium P by ejecting ink (liquid). The liquid ejecting apparatus 300 prints an image on a medium P, such as paper, on the basis of print data indicating on and off of dots on the medium P to form dots at various positions on the medium P. Examples of the medium P include, in addition to paper, plastics, film, fiber, cloth, leather, metal, glass, wood, ceramics, and any other materials that can hold liquid. Examples of the liquid ejected by the liquid ejecting apparatus 300 include, in addition to ink, various coloring materials, electrode materials, samples, such as living organic materials and inorganic materials, lubricant oil, resin liquid, etching solution, and any other liquids.

The liquid ejecting apparatus 300 includes the liquid ejecting heads 100 each including nozzles 21, a liquid container 310, a head moving mechanism 320, a transport mechanism 330 for feeding the media P, and a control unit 500.

The liquid container 310 reserves multiple kinds of ink to be ejected from the liquid ejecting heads 100. Examples of the liquid container 310 include a bag-like liquid package made of flexible film and a cartridge and an ink tank that can be detachably attached to the liquid ejecting apparatus 300.

The control unit 500 is a computer including one or more processors, a main storage, and an input/output interface that inputs and outputs signals to and from an external device. The control unit 500 controls the individual mechanisms provided in the liquid ejecting apparatus 300 to eject ink from the liquid ejecting heads 100 onto the medium P to print an image on the medium P. In other words, the control unit 500 controls the liquid ejecting operation of the liquid ejecting heads 100.

The head moving mechanism 320 includes a driving belt 321 and a carriage 322 fixed to the driving belt 321 and housing the liquid ejecting heads 100. The head moving mechanism 320 transmits a driving force from a motor (not shown) to the carriage 322 via the driving belt 321 to move the carriage 322 together with the liquid ejecting heads 100 back and forth in the main scanning direction. In this embodiment, the main scanning direction is the direction along the X direction.

The liquid ejecting heads 100 each include the nozzles 21 that eject liquid. The liquid ejecting heads 100 eject ink supplied from the liquid container 310 in the form of droplets through the nozzles 21 onto a medium P transported by the transport mechanism 330 along the sub-scanning direction crossing the main scanning direction while being reciprocated in the main scanning direction by the head moving mechanism 320. The sub-scanning direction is the direction along the X direction and is orthogonal to the main scanning direction. In another embodiment, the main scanning direction and the sub-scanning direction are not orthogonal to each other. The arrow indicated by the broken line in FIG. 1 schematically shows the movement of ink between the liquid container 310 and the liquid ejecting heads 100. The liquid ejecting apparatus 300 of this embodiment is a serial printer in which the liquid ejecting heads 100 are transported in the Y direction. In another embodiment, the liquid ejecting apparatus 300 is a line printer in which the liquid ejecting heads 100 are fixed, and in which the nozzles 21 are arranged over the entire width of the medium P. The number of liquid ejecting heads 100 provided in the liquid ejecting apparatus 300 may be either one or more.

Figure 2:
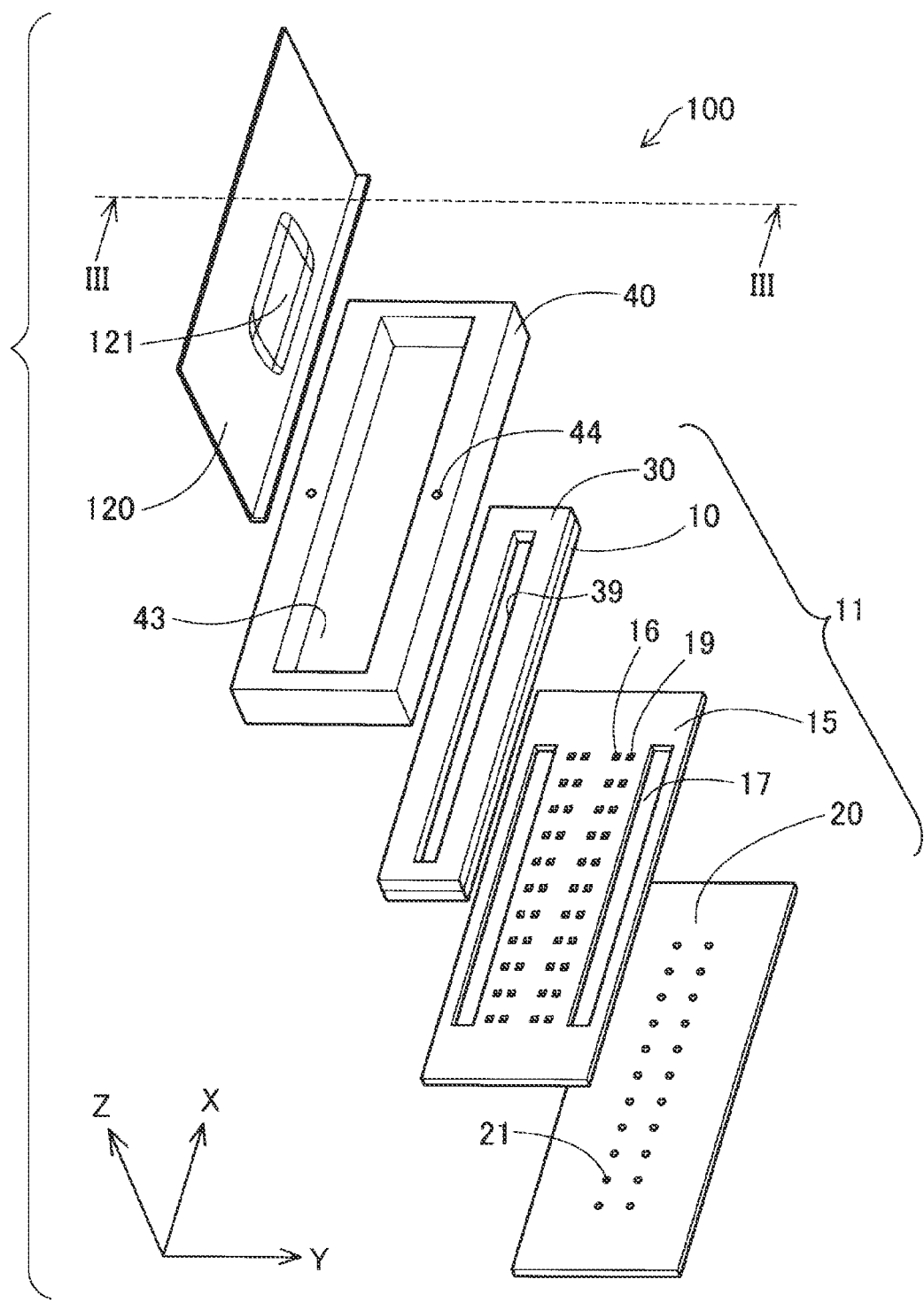
FIG. 2 is an exploded perspective view of the liquid ejecting head illustrating the configuration thereof.
Figure 3:
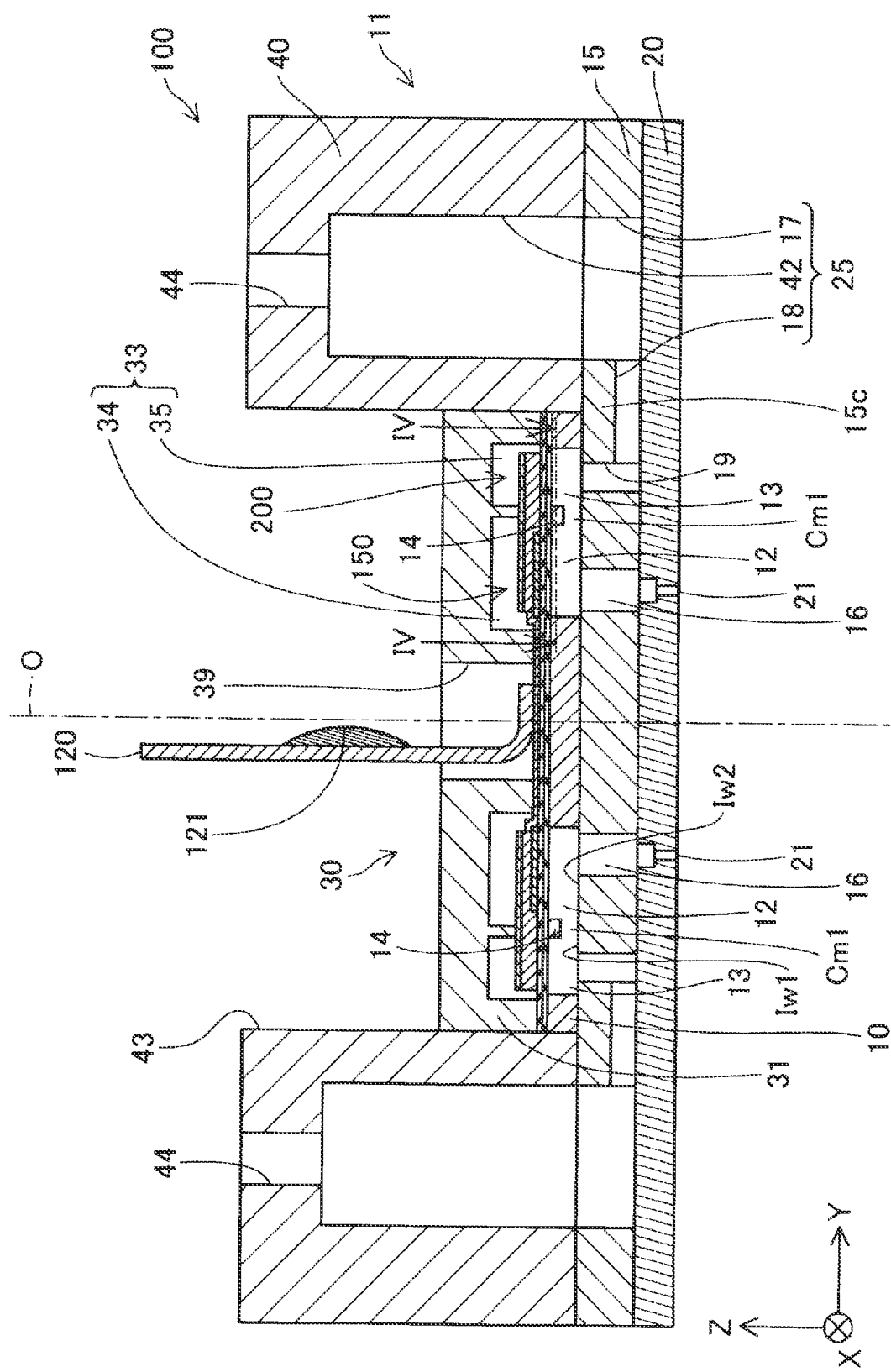
FIG. 3 is a cross-sectional view of the liquid ejecting head in FIG. 2 taken along line III-III.

FIG. 2 is an exploded perspective view of the liquid ejecting head 100 illustrating the configuration thereof. FIG. 3 is a cross-sectional view of the liquid ejecting head 100 in FIG. 2 taken along line III-III. The liquid ejecting head 100 includes a head main body 11, a case member 40, and a wiring substrate 120.

As shown in FIGS. 2 and 3, the case member 40 is fixed in the +Z direction to the head main body 11 to form the upper surface of the liquid ejecting head 100. The case member 40 includes liquid channel portions 42, a coupling port 43, and two liquid communication holes 44. The liquid channel portions 42 each form a common liquid chamber portion 25 in which liquid flows (described later). The coupling port 43 is a through-hole in which the wiring substrate 120 is placed and which passes through the case member 40 in the Z direction. The liquid communication holes 44 are openings that function as inlets for introducing the liquid supplied from the liquid container 310 to the liquid ejecting head 100 into the liquid ejecting head 100. The case member 40 is made of, for example, resin or metal.

The head main body 11 is formed of a nozzle substrate 20, a communication plate 15, a first substrate 10, and a vibrating portion 30 laid in this order. As shown in FIG. 3, the head main body 11 and the case member 40 are symmetric with respect to the central plane O. The head main body 11 and the case member 40 have the same configuration in the +Y direction and the −Y direction about the central plane O.

The nozzle substrate 20 has the nozzles 21 passing through the nozzle substrate 20 in the Z direction. The liquid ejecting head 100 ejects liquid through the nozzles 21, as described above. As shown in FIG. 2, the nozzle substrate 20 has an array of nozzles 21 arranged in the X direction. In this embodiment, an array of two rows of nozzles is formed in each nozzle substrate 20. The nozzle substrate 20 is formed of, for example, metal, such as stainless steel, an organic substance, such as a polyimide resin, or silicon single crystal.

The first substrate 10 is fixed on the communication plate 15 with an adhesive or the like. As shown in FIG. 3, the first substrate 10 has pressure chambers 12 and absorbing chambers 13 formed therein. The pressure chambers 12 and the absorbing chambers 13 constitute part of the channel of liquid.

Figure 4:
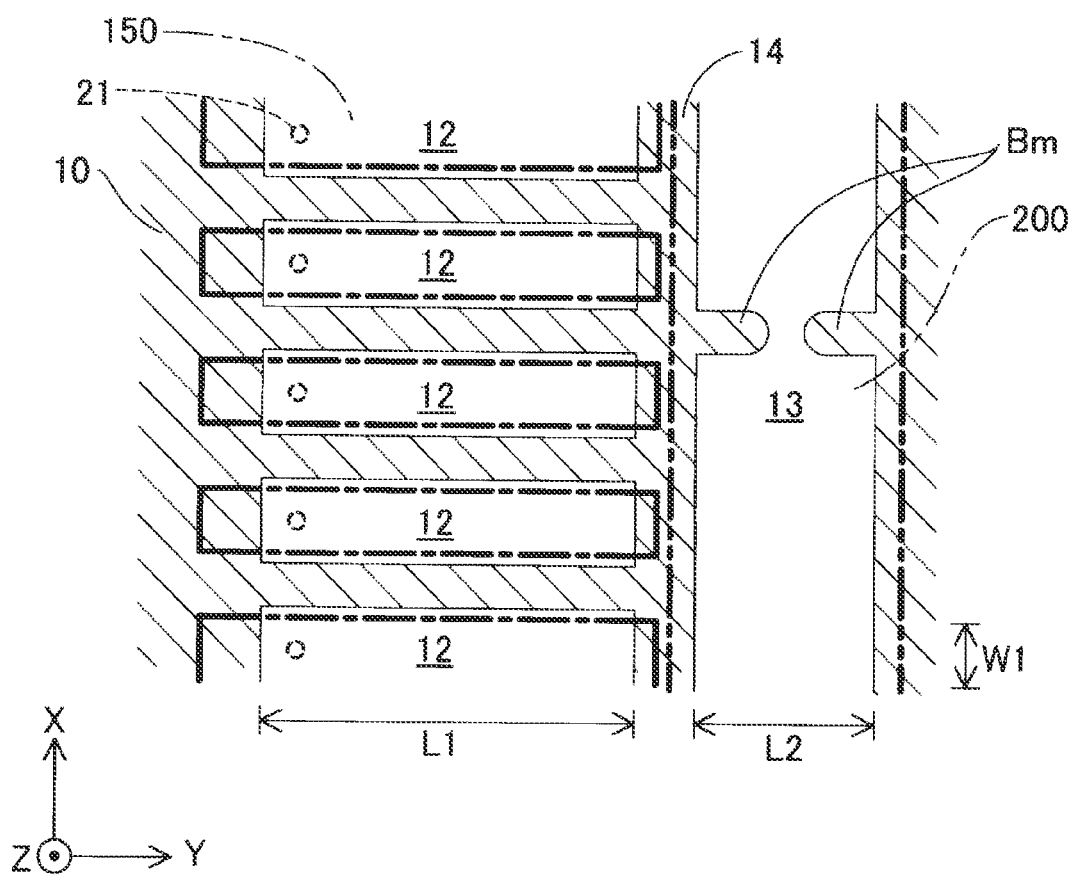
FIG. 4 is a cross-sectional view of the pressure chamber and the absorbing chamber in FIG. 3 taken along line IV-IV.

FIG. 4 is a cross-sectional view of the pressure chamber 12 and the absorbing chamber 13 in FIG. 3 taken along line IV-IV. In FIG. 4, the positions at which the nozzles 21 overlap the pressure chambers 12 when seen in the Z direction are indicated by the broken lines. FIG. 4 also shows the positions where actuators 150 overlap the pressure chambers 12 when seen in the Z direction using the one-dot chain lines and the positions where an absorption member 200 (described later) overlaps the pressure chambers 12 using the two-dot chain lines. Although FIG. 4 illustrates the actuators 150 and the absorption member 200 away from each other for the convenience of illustration, the actuators 150 and the absorption member 200 of this embodiment are actually disposed continuously in the Y direction.

As shown in FIGS. 3 and 4, the pressure chambers 12 of this embodiment extend in a second direction crossing a first direction. The first direction is the direction from the pressure chambers 12 to the nozzles 21, and in this embodiment, the direction along the Z-axis. Of the first direction, the direction from the pressure chambers 12 to the nozzles 21 is a forward direction, and the direction from the nozzles 21 to the pressure chambers 12 is an opposite direction. Accordingly, "the forward side in the first direction" with respect to the pressure chamber 12 or the absorbing chamber 13 indicates the −Z direction with respect to the pressure chamber 12 or the absorbing chamber 13, and "the opposite side in the first direction" with respect to the pressure chamber 12 or the absorbing chamber 13 indicates the +Z direction with respect to the pressure chamber 12 or the absorbing chamber 13. The second direction includes both of one direction and the opposite direction thereof along the same axis, and in this embodiment, it is the direction along the Y-axis. In this embodiment, the plurality of pressure chambers 12 are arrayed in a third direction individually in correspondence with the plurality of nozzles 21. The third direction is the direction in which the plurality of nozzles 21 are arrayed and which crosses the first direction and the second direction. The third direction includes both of one direction and the opposite direction thereof along the same axis, and in this embodiment, it is the direction along the X direction. The absorbing chamber 13 of this embodiment is provided in common to the plurality of nozzles 21.

The pressure chambers 12 and the absorbing chambers 13 are disposed at the same position in the Z direction and next to each other in the Y direction. In this embodiment, a support portion 14 which is part of the first substrate 10 and partitions the pressure chambers 12 and the absorbing chambers 13 is provided between the pressure chambers 12 and the absorbing chambers 13. As shown in FIG. 3, the pressure chamber 12 and the absorbing chamber 13 communicate with each other in the Y direction through a communication channel Cm1 provided under the support portion 14.

The first substrate 10 of this embodiment is a silicon single crystal substrate. In another embodiment, the first substrate 10 is made of metal, such as stainless steel (SUS) or nickel (Ni), a ceramic material typified by zirconia (ZrO2) or alumina (Al2O3), a glass ceramic material, or oxide, such as magnesium oxide (MgO), lanthanum aluminum oxide (LaAlO3). In this embodiment, the pressure chambers 12 and the absorbing chambers 13 are formed by processing the first substrate 10 by anisotropic etching, for example. The details of the functions of the pressure chambers 12 and the absorbing chambers 13 will be described later.

As shown in FIGS. 2 and 3, the communication plate 15 is disposed between the nozzle substrate 20 and the first substrate 10 and is fixed on the nozzle substrate 20 with an adhesive or the like. The communication plate 15 is, for example, a silicon single crystal substrate. The communication plate 15 has first communication channels 16, first common liquid chambers 17, second common liquid chambers 18, and second communication channels 19 formed therein. The first common liquid chambers 17 pass through the communication plate 15 in the Z direction. The second common liquid chambers 18 are lower recessed surfaces of the communication plate 15 not passing through the communication plate 15 in the Z direction. Each first common liquid chamber 17 and each second common liquid chamber 18 form the common liquid chamber portion 25 together with the liquid channel portion 42 formed in the case member 40. The common liquid chamber portion 25 forms part of the channel of liquid and reserves liquid to be supplied to the plurality of nozzles 21 in common.

The first communication channel 16 is a channel that communicates between the pressure chamber 12 and the nozzle 21. The second communication channel 19 is a channel that communicates between the absorbing chamber 13 and the common liquid chamber portion 25. The first communication channel 16 communicates with an inner wall Iw1 of the pressure chamber 12 on the forward side in the first direction. The second communication channel 19 communicates with an inner wall Iw2 of the absorbing chamber 13 on the forward side in the first direction. In other words, the first communication channel 16 communicates with the pressure chamber 12 from below the pressure chamber 12, and the second communication channel 19 communicates with the absorbing chamber 13 from below the absorbing chamber 13. Since the pressure chamber 12 and the nozzles 21 communicate via the first communication channel 16, the distance therebetween is larger than that of a case in which the pressure chamber 12 and the nozzle 21 communicate directly. This prevents the ink in the pressure chamber 12 from being influenced by the evaporation of water in the ink in the vicinity of the nozzle 21. Furthermore, since the communication plate 15 is provided between the nozzle substrate 20 and the first substrate 10 and the case member 40, the nozzle substrate 20 is provided with sufficient flatness provided as compared with a case in which the first substrate 10 and the nozzle substrate 20 and the case member 40 are disposed in contact. This stabilizes the quality of the liquid ejected from the nozzles 21.

The vibrating portion 30 is disposed on the first substrate 10. As shown in FIG. 3, the vibrating portion 30 includes a second substrate 31 laid on the first substrate 10, the actuator 150, and the absorption member 200.

Figure 5:
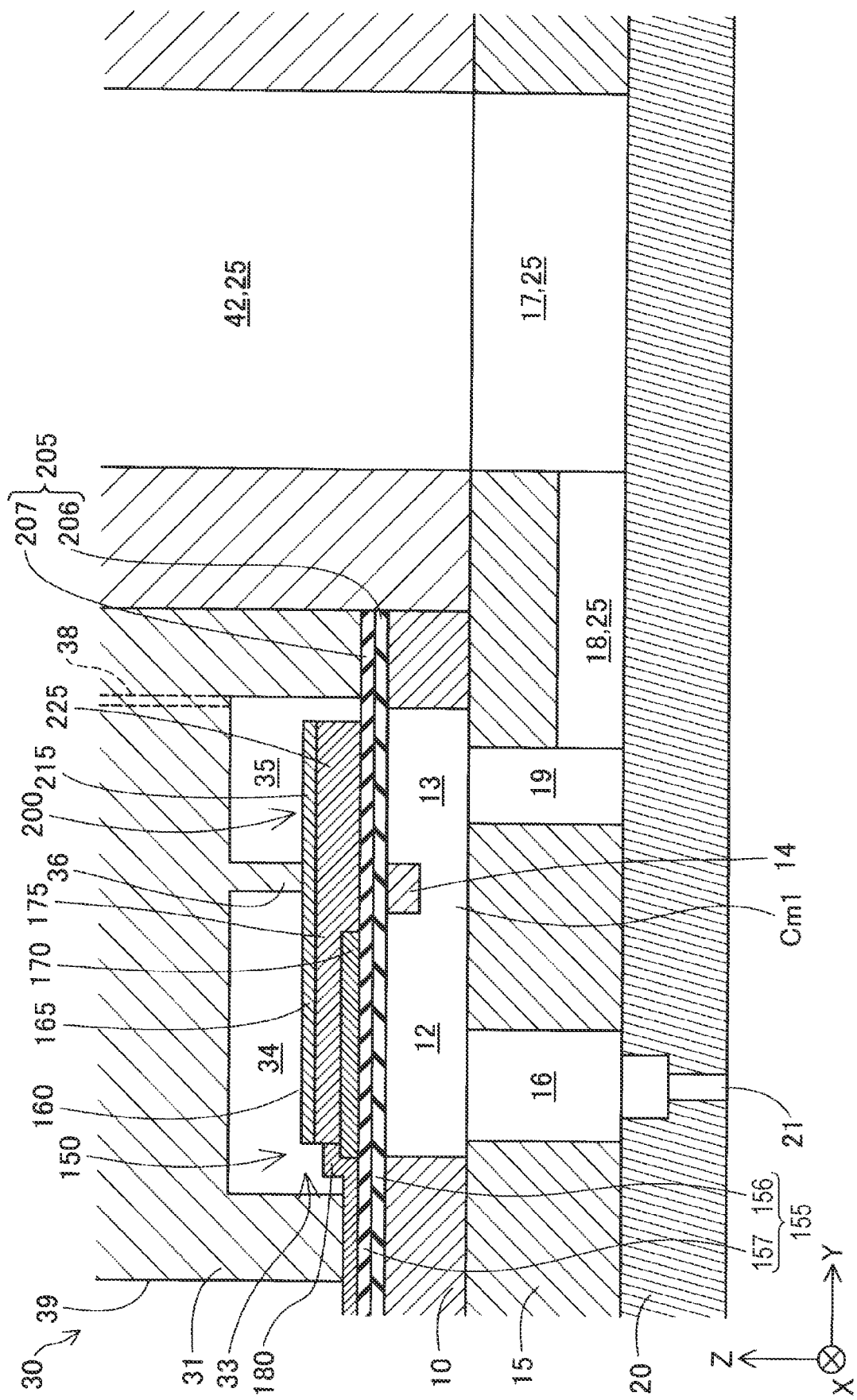
FIG. 5 is an enlarged view of the vibrating portion in FIG. 3.

FIG. 5 is an enlarged view of the vibrating portion 30 in FIG. 3. As shown in FIGS. 3 and 5, the actuator 150 of the vibrating portion 30 is disposed on the opposite side in the first direction with respect to the pressure chamber 12, that is, above the pressure chamber 12. The actuator 150 includes a vibration plate 155 and a piezoelectric element 160.

The vibration plate 155 is laid on the first substrate 10. The piezoelectric element 160 is laid on the vibration plate 155. The vibration plate 155 of this embodiment includes a flexible layer 156 formed on the first substrate 10 and a protective layer 157 formed on the flexible layer 156. The flexible layer 156 is made of silicon dioxide, for example. The protective layer 157 is made of zirconium oxide, for example.

The piezoelectric element 160 includes a first electrode 165, a second electrode 170, a piezoelectric substance 175, and a wiring portion 180. The second electrode 170 is disposed nearer to the pressure chamber 12 in the Z direction than the first electrode 165. The piezoelectric substance 175 is disposed between the first electrode 165 and the second electrode 170. In this embodiment, the second electrode 170 is disposed on the protective layer 157 of the vibration plate 155. In other words, the second electrode 170 is disposed under the piezoelectric substance 175 and is sometimes referred to as "lower electrode". The second electrode 170 of this embodiment is disposed in the Y direction for each of the plurality of nozzles 21 and is sometimes referred to as "individual electrode". The first electrode 165 is disposed on the piezoelectric substance 175 provided on the second electrode 170 and is sometimes referred to as "upper electrode". The first electrode 165 of this embodiment is disposed in the X direction and the Y direction in common to the plurality of nozzles 21 and is sometimes referred to as "common electrode".

The wiring portion 180 is electrically coupled to the first electrode 165 or the second electrode 170. In this embodiment, the second electrode 170 is electrically coupled to the wiring portion 180 and is electrically coupled to a drive circuit 121 (described later) of the wiring substrate 120 via the wiring portion 180.

The piezoelectric substance 175 of this embodiment is made of lead zirconate titanate (PZT). Instead of PZT, the piezoelectric substance 175 may be made of another kind of ceramic material with a so-called perovskite structure, typified by ABO3 type, for example, barium titanate, lead titanate, potassium niobate, lithium niobate, lithium tantalate, sodium tungstate, zinc oxide, barium strontium titanate (BST), strontium bismuth tantalate (SBT), lead metaniobate, lead zinc niobate, or lead scandium niobate. Instead of the ceramic material, the piezoelectric substance 175 may also be made of any material having a piezoelectric effect, such as polyvinylidene fluoride or crystal.

The first electrode 165 and the second electrode 170 of this embodiment are made of platinum. Instead of platinum, the first electrode 165 and the second electrode 170 may also be made of another kind of metal, such as iridium, titanium, tungsten, or tantalum, or conductive metal oxide, such as lanthanum nickel oxide (LaNiO3). The wiring portion 180 of this embodiment is made of gold. The wiring portion 180 may also be made of another conductive material.

The absorption member 200 is disposed on the opposite side in the first direction with respect to the absorbing chamber 13, that is, above the absorbing chamber 13. The absorption member 200 is formed of at least part of the components of the actuator 150. The absorption member 200 of this embodiment includes a vibration plate member 205 constituting the vibration plate 155, a first electrode member 215 constituting the first electrode 165, and a piezoelectric member 225 constituting the piezoelectric substance 175. The vibration plate member 205 includes a flexible layer member 206 constituting the flexible layer 156 and a protective layer member 207 constituting the protective layer 157.

In this embodiment, the absorption member 200 is integrally formed with the actuator 150. Specifically, the vibration plate 155 and the vibration plate member 205 are integrally formed, the first electrode 165 and the first electrode member 215 are integrally formed, and the piezoelectric substance 175 and the piezoelectric member 225 are integrally formed.

The second substrate 31 has a recess 33 and is laid on the first substrate 10 in the Z direction. The recess 33 is open facing the pressure chamber 12 and the absorbing chamber 13 on the opposite side in the first direction with respect to the pressure chamber 12 and the absorbing chamber 13. Specifically, the second substrate 31 of this embodiment has, as the recess 33, a first recess 34 and a second recess 35 beside the first recess 34 in the Y direction. The first recess 34 is open facing the pressure chamber 12, and the second recess 35 is open facing the absorbing chamber 13. The first recess 34 and the second recess 35 are partitioned by a wall 36 which is part of the second substrate 31. In this embodiment, the opening of the first recess 34 and the opening of the second recess 35 are equal in depth. In other words, the dimension of the first recess 34 in the Z direction and the dimension of the second recess 35 in the Z direction are equal. The recess 33 does not communicate with the channel of the liquid, and no liquid flows in the recess 33. In other words, no liquid flows through the first recess 34 and the second recess 35.

The second recess 35 of this embodiment communicates with the outside. Specifically, the second recess 35 communicates with the atmosphere at the position of the second recess 35 overlapping an end in the X direction through an atmosphere communicating hole 38 in the second substrate 31. This allows the pressure in the second recess 35 to be kept at atmospheric pressure.

Specifically, the second substrate 31 is laid on the first substrate 10, with the ends of the actuator 150 and the absorption member 200 in the Y direction sandwiched between the second substrate 31 and the first substrate 10. Since the second substrate 31 is laid on the first substrate 10, the actuator 150 is disposed in the first recess 34, and the absorption member 200 is disposed in the second recess 35.

The second substrate 31 of this embodiment is a silicon single crystal substrate as is the first substrate 10. In another embodiment, the second substrate 31 is made of metal, such as stainless steel (SUS) or nickel (Ni), a ceramic material typified by zirconia (ZrO2) or alumina (Al2O3), a glass ceramic material, or oxide, such as magnesium oxide (MgO), lanthanum aluminum oxide (LaAlO3).

As shown in FIGS. 2 and 3, the second substrate 31 of this embodiment has, at the center in the Y direction, a through-hole 39 passing through the second substrate 31 in the Z direction. As shown in FIG. 3, the wiring substrate 120 inserted in the coupling port 43 of the case member 40 is inserted in the through-hole 39. The wiring substrate 120 is provided with the drive circuit 121 described above. The drive circuit 121 is a circuit for driving the actuator 150. The drive circuit 121 is electrically coupled to the first electrode 165 via the wiring substrate 120 and electrical wiring lines (not shown) or the like and is electrically coupled to the second electrode 170 via the wiring substrate 120 and the wiring portion 180 of the actuator 150. The drive circuit 121 is also electrically coupled to the control unit 500 via the wiring substrate 120 and electrical wiring lines (not shown) or the like.

The pressure chamber 12 described above applies pressure to the liquid in the pressure chamber 12 by the vibration of the vibration plate 155. The vibration plate 155 is vibrated by the driving of the piezoelectric element 160. Specifically, a voltage applied to the piezoelectric substance 175 via the first electrode 165, the second electrode 170, and the wiring portion 180 causes a piezoelectric strain in an active portion of the piezoelectric substance 175 sandwiched by the first electrode 165 and the second electrode 170 in the Z direction. The piezoelectric element 160 vibrates the vibration plate 155 so that it is bent by the piezoelectric strain to change the capacity of the pressure chamber 12, thereby applying pressure to the liquid in the pressure chamber 12. The piezoelectric strain does not occur in an inactive portion of the piezoelectric substance 175 not sandwiched between the first electrode 165 and the second electrode 170 in the Z direction even if a voltage is applied to the piezoelectric substance 175.

The liquid ejecting head 100 ejects liquid through the nozzles 21 by applying pressure to the liquid in the pressure chambers 12, as described above. When pressure is applied to the liquid in the pressure chambers 12, part of the liquid in the pressure chambers 12 flows to a liquid chamber and so on common to the plurality of pressure chambers 12 upstream from the pressure chambers 12, and the vibration of the liquid propagates from the pressure chambers 12 to the liquid chamber and so on. When pressure is applied to the liquid in the plurality of pressure chambers 12, liquid flowing from one pressure chamber 12 to the liquid chamber and so on is influenced; for example, the flow of liquid from another pressure chamber 12 to the liquid chamber and so on is hindered. This can cause the aspect of propagation of the vibration of the liquid from one pressure chamber 12 to be changed due to the influence of propagation of the vibration of the liquid from another pressure chamber 12, decreasing the stability of the quality of the liquid ejected from the nozzles 21 via the pressure chamber 12.

The absorbing chamber 13 described above absorbs the vibration of the liquid propagated from the pressure chambers 12. Specifically, the absorption member 200 disposed on the opposite side in the first direction with respect to the absorbing chamber 13 is bent according to the vibration of the liquid propagated from the pressure chamber 12 to the absorbing chamber 13 to absorb the vibration of the liquid. As shown in FIG. 5, since the pressure chamber 12 and the absorbing chamber 13 are disposed at the same position in the Z direction and next to each other in the Y direction, the absorbing chamber 13 can effectively absorb the vibration of the liquid propagated from the pressure chamber 12. The absorption member 200 may be formed so as to have flexibility suitable for absorbing the vibration of the liquid propagated from the pressure chamber 12 by selecting a material for absorption member 200 or adjusting the thickness and so on of the absorption member 200. If the absorption member 200 includes a member constituting the piezoelectric element 160, as in this embodiment, the absorption member 200 may be configured not to generate a piezoelectric strain in the piezoelectric substance 175 when a voltage is applied thereto.

As shown in FIG. 4, in this embodiment, the length L1 of the pressure chamber 12 in the Y direction is larger than the length L2 of the absorbing chamber 13 in the Y direction.

This can increase the capacity of the pressure chamber 12 as compared with a case in which the length L1 is smaller than the length L2 or a case in which the length L1 and the length L2 are equal to each other. In this embodiment, the pressure chamber 12 is provided for each of the plurality of nozzles 21, and the absorbing chamber 13 is provided in common to the plurality of nozzles 21, as described above. For this reason, the length W1 of the actuator 150 corresponding to one pressure chamber 12 in the X direction is smaller than the length W2 of the absorption member 200 corresponding to one absorbing chamber 13 in the X direction. This makes it easy to provide the absorption member 200 with sufficient flexibility as compared with a case in which the length W1 is larger than the length W2 and a case in which the length W1 and the length W2 are equal to each other. The length W2 is omitted in FIG. 4 for the convenience of illustration.

As shown in FIG. 4, the absorbing chamber 13 of this embodiment has a plurality of beams Bm that are in contact with the absorption member 200 from below. The beams Bm are part of the first substrate 10 and are disposed at regular intervals in the X direction. The beams Bm of this embodiment are a set of two protrusions protruding in the Y direction from opposite sides of the absorbing chamber 13 in the Y direction toward the center of the absorbing chamber 13 in the Y direction and have a gap therebetween. Thus, the beams Bm provide the absorption member 200 with sufficient strength and do not reduce the flexibility of the absorption member 200. FIG. 4 illustrates only one set of beams Bm for the convenience of illustration. In another embodiment, the beams Bm have another shape; for example, one set of beams Bm may be in the form of one beam crossing the absorbing chamber 13 in the Y direction. In another embodiment, the beams Bm are not provided. Whether to provide the beams Bm, the shape and the size of the beams Bm, the intervals between the beams Bm, and so on may be determined to provide the absorption member 200 with flexibility suitable for absorbing the vibration of the liquid propagated from the pressure chambers 12.

The actuators 150 and the absorption member 200 of this embodiment may be produced using a known method, such as etching using photoresist masking. For example, the components of the absorption member 200 may be formed using the same method as a method for forming the components of the actuators 150.

The liquid ejecting head 100 of the first embodiment described above is configured such that the actuators 150 are disposed on the opposite side in the first direction with respect to the pressure chambers 12, and the absorption member 200, which is formed of at least part of the components of the actuators 150, is disposed on the opposite side in the first direction with respect to the absorbing chamber 13 disposed at the same position as that of the pressure chamber 12 in the Z direction and next thereto in the Y direction. This allows the absorption member 200 and the actuators 150 to be made of the same material, thereby reducing the kind of the materials of the components of the liquid ejecting head 100. This makes it easy to manufacture the absorption member 200 with components of the actuators 150 and allows the vibration of the liquid to be efficiently absorbed by the absorption member 200 in the absorbing chamber 13. Furthermore, manufacturing the components of the absorption member 200 and the components of the actuators 150 using the same manufacturing method further simplifies the process for manufacturing the liquid ejecting head 100. Furthermore, integrally forming the absorption member 200 and the actuators 150 further simplifies the process for manufacturing the liquid ejecting head 100.

In this embodiment, the second substrate 31 laid on the first substrate 10 has the recess 33 that is open facing the pressure chamber 12 and the absorbing chamber 13 on the opposite side in the first direction with respect to the pressure chamber 12 and the absorbing chamber 13. This allows the actuator 150 and the absorption member 200 to be protected by the recess 33.

In this embodiment, the recess 33 includes the first recess 34 that is open facing the pressure chamber 12 and the second recess 35 that is disposed beside the first recess 34 in the second direction and is open facing the absorbing chamber 13. This allows the actuator 150 to be protected by the first recess 34, and the absorption member 200 to be protected by the second recess 35 and increases the strength of the second substrate 31 as compared with a case in which the recess 33 includes only one recess.

The second recess 35 communicates with the outside. This allows the pressure in the second recess 35 to be kept at the atmospheric pressure with the simple configuration.

In this embodiment, the pressure chamber 12 is provided for each of the plurality of nozzles 21, and the absorbing chamber 13 is provided in common to the plurality of nozzles 21. This allows the pressure chambers 12 corresponding to the nozzles 21 to individually apply pressure to the liquid and also allows the absorbing chamber 13 common to the plurality of nozzles 21 to absorb the vibration of the liquid propagated from the pressure chambers 12.

In this embodiment, the length W1 of the actuator 150 corresponding to one pressure chamber 12 in the X direction is smaller than the length W2 of the absorption member 200 corresponding to one absorbing chamber 13 in the X direction. This makes it easy to provide sufficient flexibility to the absorption member 200 as compared with a case in which the length W1 is larger than the length W2 or a case in which the length W1 is equal to the length W2. This allows the absorption member 200 to effectively absorb the vibration of the liquid propagated from the pressure chambers 12 to the absorbing chamber 13.

In this embodiment, the length L1 of each pressure chamber 12 in the Y direction is larger than the length L2 of the absorbing chamber 13 in the Y direction. This increases the capacity of the pressure chamber 12 as compared with a case in which the length L1 is smaller than the length L2 or a case in which the length L1 is equal to the length L2. This allows effectively applying pressure to the liquid in the pressure chamber 12.

Since the absorption member 200 of this embodiment includes the vibration plate member 205, the first electrode member 215, and the piezoelectric member 225, the durability of the absorption member 200 is higher than a case in which the absorption member 200 includes only the vibration plate member 205. In another embodiment, the absorption member 200 includes at least part of the components of the actuator 150 and has a different configuration from that of this embodiment. For example, the absorption member 200 may include only the vibration plate member 205 or may include the components of the second electrode 170.

The absorption member 200 of this embodiment is made of at least part of the materials of the actuator 150 and does not include resin film. For this reason, even if the liquid used is organic-solvent ink or the like, the corrosion of the materials contained in the absorption member 200 is prevented, and the ink resistance of the absorption member 200 is enhanced. Furthermore, since the absorption member 200 does not include resin film, and an adhesive for fixing the absorption member 200 is not needed, the elution of the adhesive is prevented.

B. Second Embodiment

Figure 6:
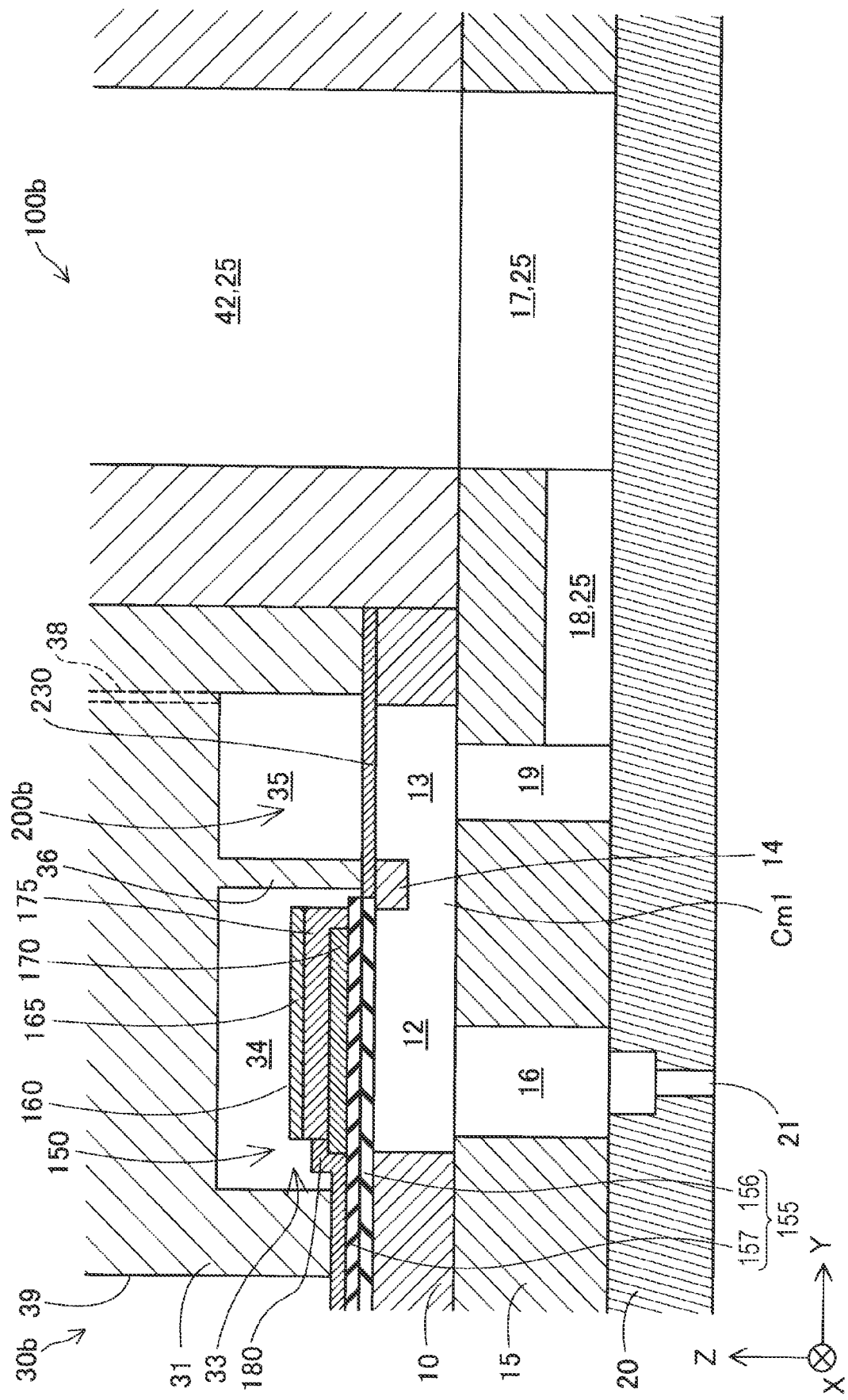
FIG. 6 is a cross-sectional view of a vibrating portion of a liquid ejecting head according to a second embodiment.

FIG. 6 is a cross-sectional view of a vibrating portion 30b of a liquid ejecting head 100b according to a second embodiment. An absorption member 200b of the vibrating portion 30b of this embodiment includes a wiring member 230 constituting the wiring portion 180 of the actuator 150, unlike the first embodiment. Part of the configuration of a liquid ejecting apparatus 300 and the liquid ejecting head 100b of the second embodiment that is not described in particular is the same as that of the first embodiment.

The absorption member 200b of this embodiment is the wiring member 230. The wiring portion 180 of this embodiment is made of gold, as in the first embodiment, and the wiring member 230 is also made of gold. In this embodiment, the wiring portion 180 and the wiring member 230 are not integrally formed. The wiring member 230 is not electrically coupled to the drive circuit 121. Thus, even if a voltage is applied to the piezoelectric substance 175, no current flows through the wiring member 230. In another embodiment, the wiring portion 180 and the wiring member 230 are integrally formed, and the wiring member 230 is electrically coupled to the drive circuit 121.

In this embodiment, since the absorption member 200b is made of the member constituting the wiring portion 180, the kind of the material for the components of the liquid ejecting head 100b can be reduced, and the process of manufacturing the liquid ejecting head 100b can be simplified. Since the wiring portion 180 contains gold, the conductivity of the wiring portion 180 and the flexibility of the wiring portion 180 are increased, and the durability of the wiring portion 180 is enhanced. Furthermore, since the absorption member 200b contains gold as the wiring portion 180 does, the flexibility of the absorption member 200b is increased, and the durability of the absorption member 200b is enhanced. The absorption member 200b of this embodiment can be formed by forming the wiring member 230 on the first substrate 10 by sputtering and etching when the wiring portion 180 is formed on the first substrate 10 by sputtering and etching.

The absorption member 200b of the liquid ejecting head 100b of the second embodiment described above can also be easily manufactured with components of the actuator 150, and the vibration of the liquid can be effectively absorbed by the absorption member 200b in the absorbing chamber 13. In particular, in this embodiment, the absorption member 200b can be formed with the member constituting the wiring portion 180.

In this embodiment, the wiring portion 180 contains at least gold. This increases the conductivity and the flexibility of the wiring portion 180, thereby enhancing the durability of the wiring portion 180. Since the wiring member 230 contains gold as the wiring portion 180 does, the flexibility and the durability of the absorption member 200b are enhanced.

In another embodiment, the absorption member 200b includes the wiring member 230 and a member other than the wiring portion 180 constituting the actuator 150. For example, the absorption member 200b may include the vibration plate member 205 and the wiring member 230.

C. Third Embodiment

Figure 7:
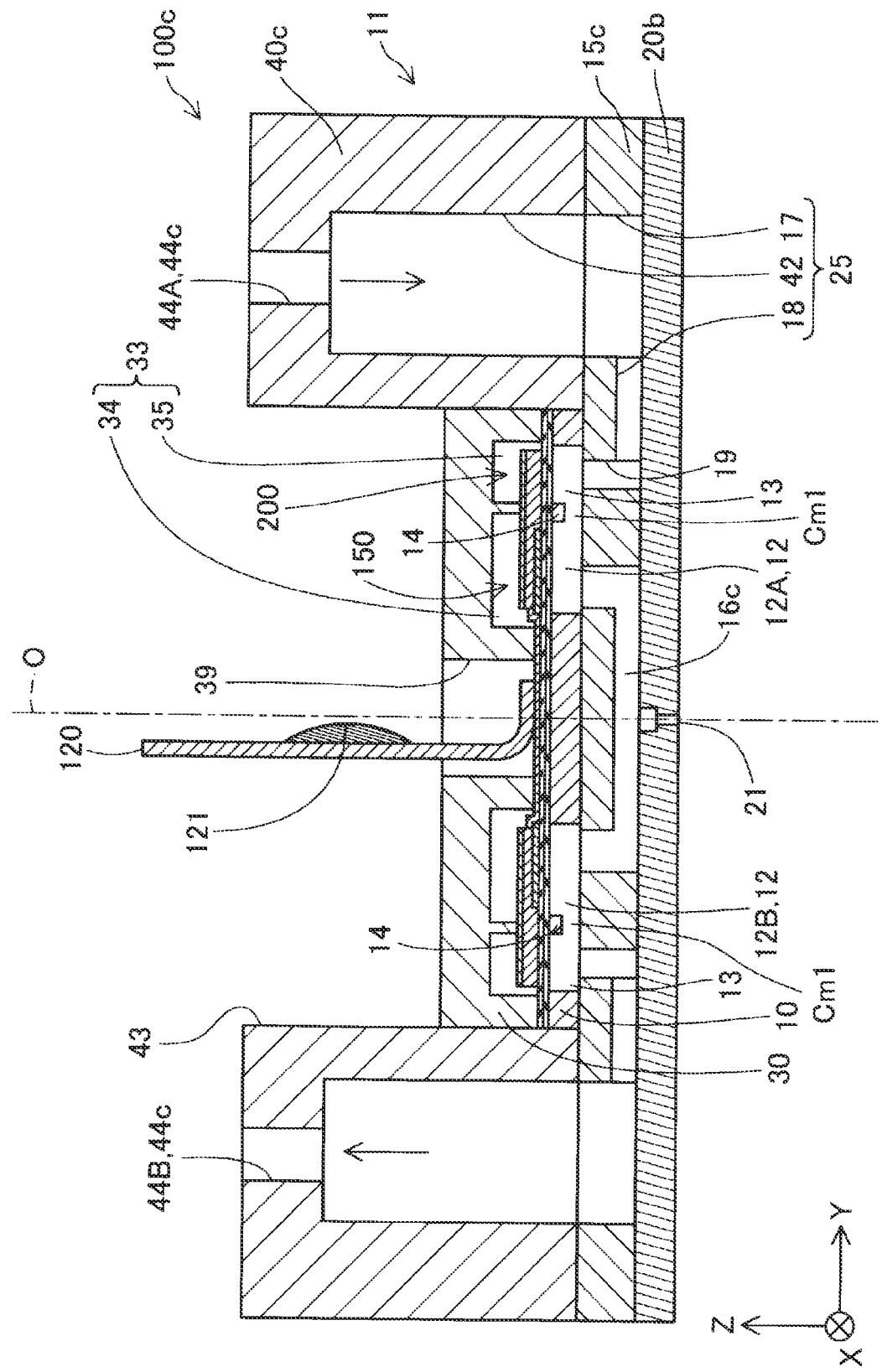
FIG. 7 is a cross-sectional view of a liquid ejecting head according to a third embodiment.

FIG. 7 is a cross-sectional view of a liquid ejecting head 100c according to a third embodiment. In this embodiment, a plurality of pressure chambers 12 are provided for one nozzle 21, unlike the first embodiment. Part of the configuration of a liquid ejecting apparatus 300 and the liquid ejecting head 100c of the third embodiment that is not described in particular is the same as that of the first embodiment.

A nozzle substrate 20b of this embodiment has one row of nozzles, unlike the first embodiment. Specifically, a plurality of nozzles 21 are arrayed in the X direction at the center of a nozzle substrate 20b in the Y direction.

A first communication channel 16c formed in a communication plate 15c of this embodiment is configured to communicate between two pressure chambers 12 located at the same position in the X direction and to communicate with one nozzle 21, unlike the first embodiment. Thus, in this embodiment, one nozzle 21 and two pressure chambers 12 are associated with each other.

One of two liquid communication holes 44c provided in the case member 40c of this embodiment functions as a liquid inlet 44A for introducing liquid into the liquid ejecting head 100c, and the other functions as a liquid outlet 44B for recovering the liquid from the liquid ejecting head 100c to the liquid container 310, unlike the first embodiment. Specifically, the liquid communication hole 44c in the +Y direction with respect to the central plane O functions as the liquid inlet 44A, and the liquid communication hole 44c in the −Y direction with respect to the central plane O functions as the liquid outlet 44B. This allows the liquid ejecting head 100c of this embodiment allows liquid to circulate between the liquid container 310 and the liquid ejecting head 100c by letting the liquid flow from the liquid inlet 44A toward the liquid outlet 44B, as indicated by the arrows in FIG. 7.

In this embodiment, of the two pressure chambers 12, a pressure chamber 12B provided in the −Y direction with respect to the central plane O can not only function as a channel for recovering the liquid from the liquid ejecting head 100c but also apply pressure to the liquid in the pressure chamber 12B to send the liquid to the nozzle 21 using the actuator 150. This increases the amount of liquid ejected from the nozzle 21 as compared with a case in which a pressure is applied to the liquid only in the pressure chamber 12A provided in the +Y direction with respect to the central plane O.

Since this embodiment also includes the absorbing chamber 13 and the actuator 150 formed of at least part of the components of the absorption member 200, the vibration of the liquid propagated from the pressure chambers 12 can be absorbed in the absorbing chamber 13 using the absorption member 200, as in the first embodiment.

The absorption member 200 of the liquid ejecting head 100c of the third embodiment described above can also be easily manufactured with components of the actuator 150, and the vibration of the liquid can be effectively absorbed by the absorption member 200b in the absorbing chamber 13. In particular, in this embodiment, even if a plurality of pressure chambers 12 are provided for each nozzle 21, the absorption member 200 can easily be manufactured, and the vibration of the liquid can be effectively absorbed in the absorbing chamber 13 using the absorption member 200.

In another embodiment, when a plurality of pressure chambers 12 are provided for each nozzle 21 as in the third embodiment, the liquid ejecting head 100 is not configured to circulate the liquid. In this case, for example, the liquid ejecting head 100 is configured to eject the liquid introduced from the two liquid communication holes 44 through one nozzle 21. Also in this case, the amount of liquid ejected from the nozzle 21 can be increased as compared with a case in which the liquid introduced from one liquid communication hole 44 is ejected through one nozzle 21. Furthermore, the absorption member 200 can easily be manufactured, and the vibration of the liquid can effectively be absorbed in the absorbing chamber 13 using the absorption member 200.

D. Fourth Embodiment

Figure 8:
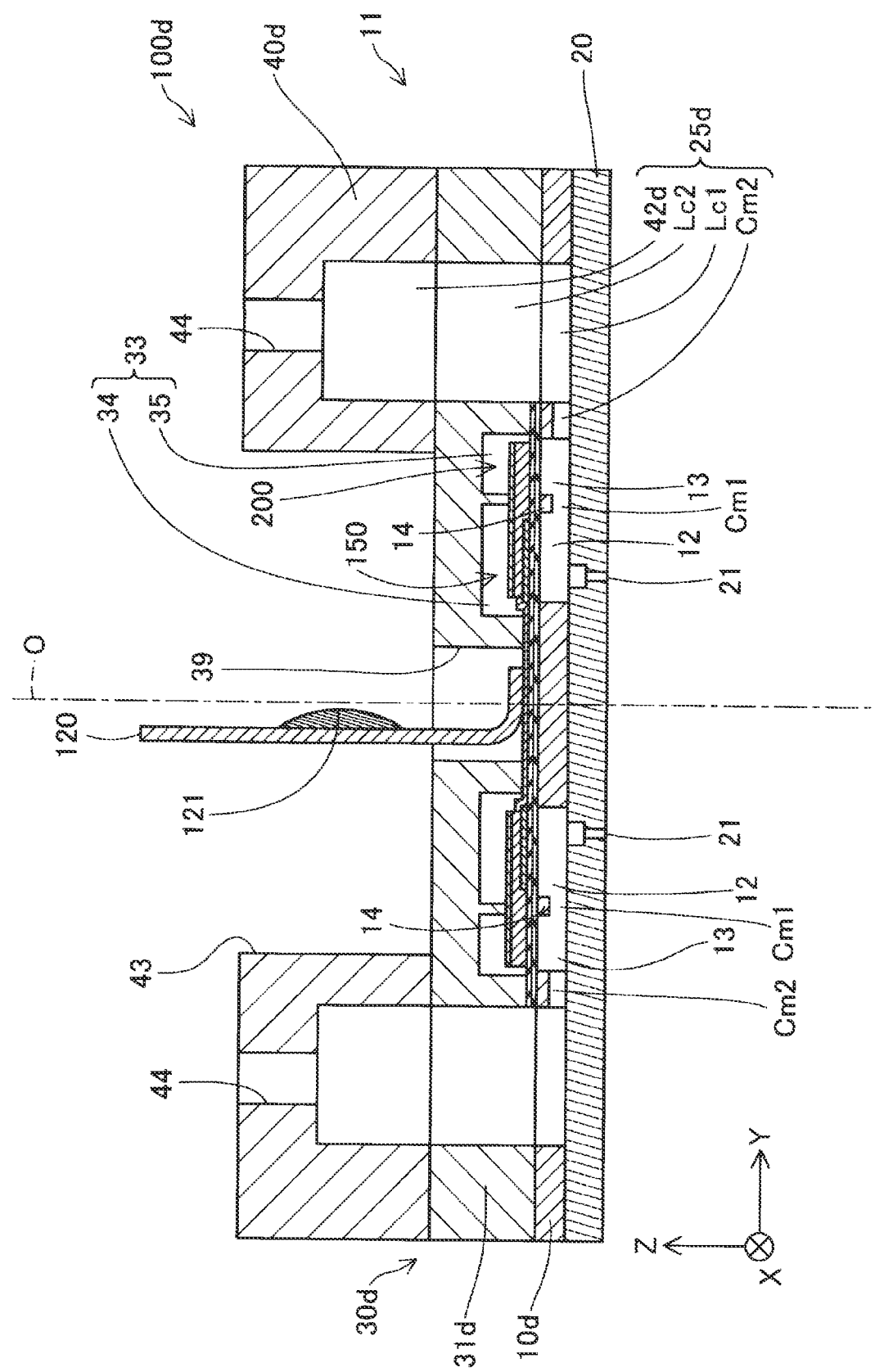
FIG. 8 is a cross-sectional view of a liquid ejecting head according to a fourth embodiment.

FIG. 8 is a cross-sectional view of a liquid ejecting head 100d according to a fourth embodiment. Unlike the first embodiment, the liquid ejecting head 100d of this embodiment does not include the communication plate 15 and the first and second communication channels 16 and 19. Of the configuration of a liquid ejecting apparatus 300 and the liquid ejecting head 100d of the fourth embodiment, part that is not described in particular is the same as that of the first embodiment.

A first substrate 10d of this embodiment has a liquid channel Lc1 that passes through the first substrate 10d in the Z direction and a communication channel Cm2 that communicates between the liquid channel Lc1 and the absorbing chamber 13 in the Y direction. A second substrate 31d of a vibrating portion 30d of this embodiment has a liquid channel Lc2 that passes through the second substrate 31d in the Z direction. A common liquid chamber portion 25d of this embodiment includes a liquid channel portion 42d of a case member 40d, the liquid channel Lc1, the liquid channel Lc2, and the communication channel Cm2.

The absorption member 200 of the liquid ejecting head 100d of the fourth embodiment described above can also be easily manufactured with components of the actuator 150, and the vibration of the liquid can be effectively absorbed by the absorption member 200 in the absorbing chamber 13.

In another embodiment, the liquid ejecting head 100 that does not include the communication plate 15 as in the fourth embodiment is configured to circulate the liquid, as in the third embodiment.

E. Fifth Embodiment

Figure 9:
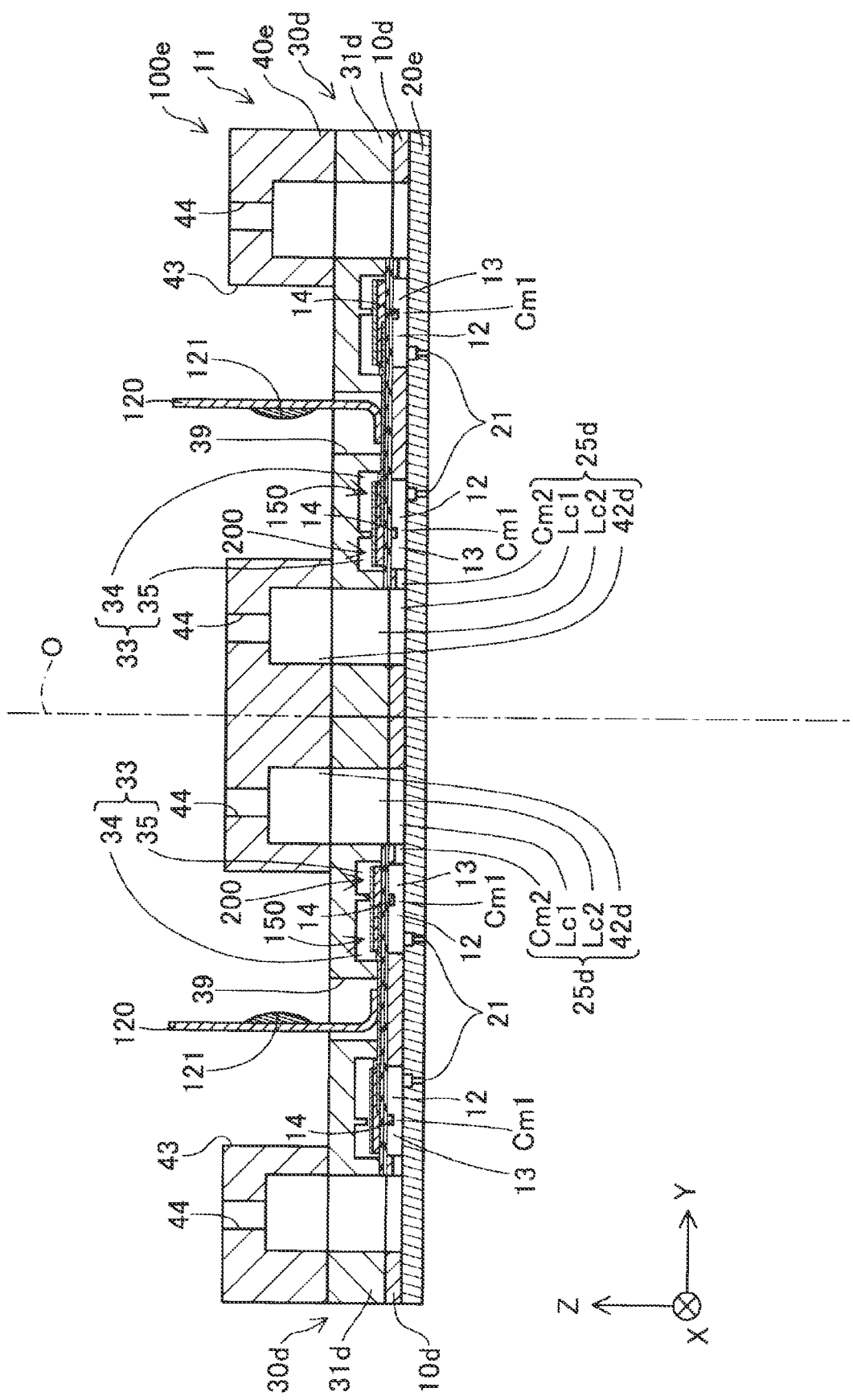
FIG. 9 is a cross-sectional view of a liquid ejecting head according to a fifth embodiment.

FIG. 9 is a cross-sectional view of a liquid ejecting head 100e according to a fifth embodiment. In this embodiment, two vibrating portions 30d are provided for one nozzle substrate 20e, unlike the fourth embodiment. Of the configuration of a liquid ejecting apparatus 300 and the liquid ejecting head 100e of the fifth embodiment, part that is not described in particular is the same as that of the fourth embodiment.

The nozzle substrate 20e of this embodiment has four rows of nozzles 21 in the X direction. In this embodiment, two first substrates 10d, two vibrating portions 30d, and one case member 40e are provided for one nozzle substrate 20e. In this embodiment, the case member 40e has four liquid channel portions 42d, two coupling ports 43, and four liquid communication holes 44, and the two first substrates 10d each have two communication channels Cm1. The two first substrates 10d are laid on the nozzle substrate 20e side by side in the Y direction. The vibrating portions 30d are laid on the individual first substrates 10d. The case member 40e is laid on the two vibrating portions 30d.

Also in this embodiment, the pressure chambers 12 and the absorbing chambers 13 of each vibrating portion 30d are at the same position in the Z direction and next to each other in the Y direction. Furthermore, an absorption member 200 formed of at least part of the components of the actuator 150 is provided on the opposite side in the first direction with respect to the absorbing chamber 13. This allows absorbing the vibration of the liquid in the absorbing chamber 13 without providing a mechanism for absorbing the vibration of the liquid in the vicinity of the nozzle substrate 20e or at the case member 40e. This allows absorbing the vibration of the liquid effectively even if three or more rows of nozzles are provided in one nozzle substrate 20e, and channels corresponding to the multiple nozzles are provided in the case member 40e or the like, as in this embodiment. Such a nozzle substrate 20e and a case member 40e can easily be manufactured and can be reduced in size.

The absorption member 200 of the liquid ejecting head 100e of the fifth embodiment described above can also be easily manufactured with components of the actuator 150, and the vibration of the liquid can be effectively absorbed by the absorption member 200 in the absorbing chamber 13.

F. Sixth Embodiment

Figure 10:
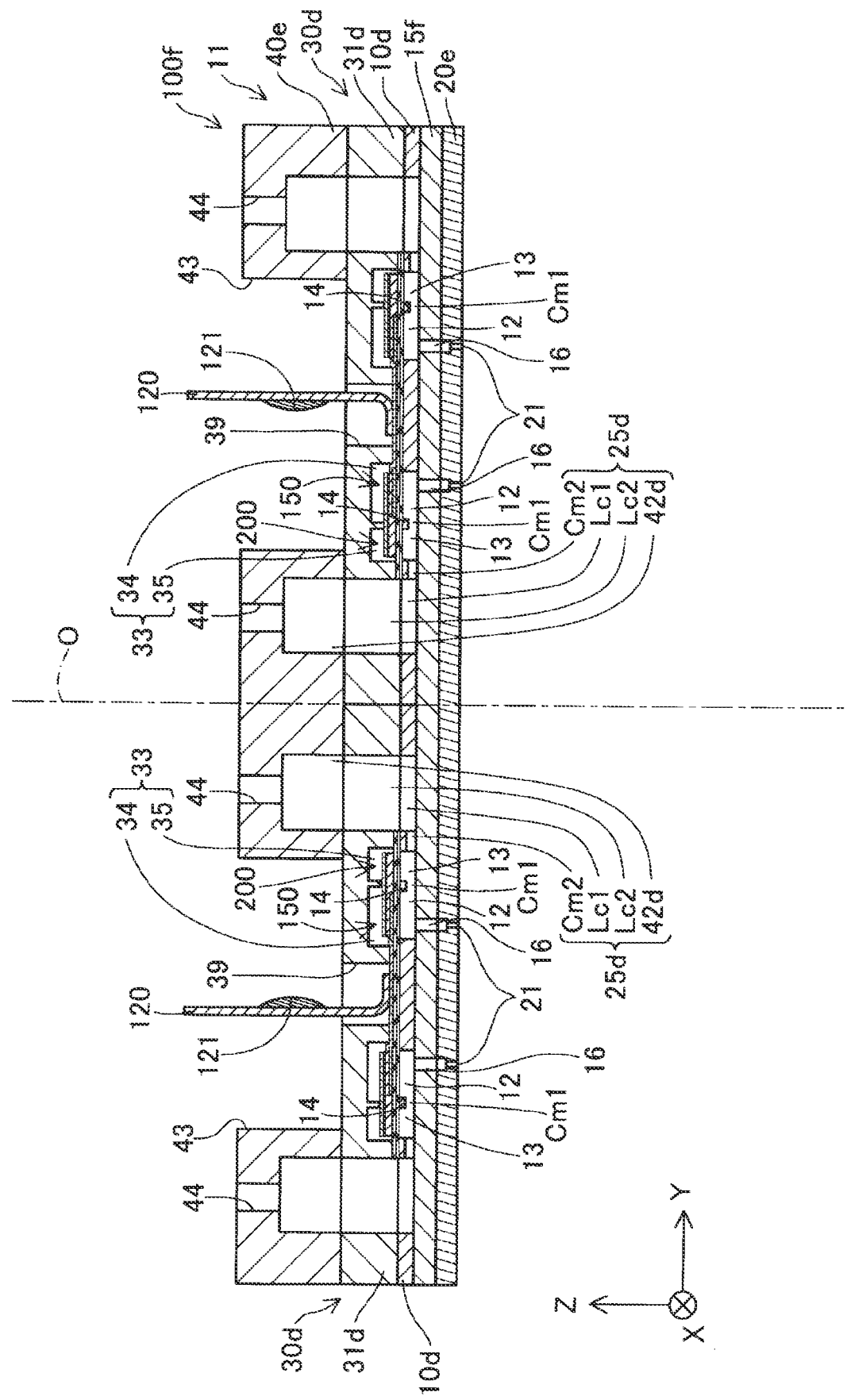
FIG. 10 is a cross-sectional view of a liquid ejecting head according to a sixth embodiment.

FIG. 10 is a cross-sectional view of a liquid ejecting head 100f according to a sixth embodiment. In this embodiment, a communication plate 15f is provided between the nozzle substrate 20e and the first substrate 10d, unlike the fifth embodiment. Of the configuration of a liquid ejecting apparatus 300 and the liquid ejecting head 100f of the sixth embodiment, part that is not described in particular is the same as that of the fifth embodiment.

Unlike the first embodiment, the communication plate 15f of this embodiment does not have the second communication channel 19 that communicates between the absorbing chamber 13 and the common liquid chamber portion 25d and has four rows of first communication channels 16 that communicate between the pressure chambers 12 and the nozzles 21 in correspondence with four rows of nozzles. Since the communication plate 15f is disposed between the nozzle substrate 20e and the first substrate 10d, the nozzle substrate 20e is given sufficient flatness, stabilizing the quality of the liquid ejected from the nozzles 21. In particular, in this embodiment, the nozzle substrate 20e has four rows of nozzles as in the fifth embodiment.

Accordingly, the quality of printing on the medium P can be enhanced more effectively by stabilizing the quality of the liquid ejected from the nozzles 21.

The absorption member 200 of the liquid ejecting head 100f of the sixth embodiment described above can also be easily manufactured with components of the actuator 150, and the vibration of the liquid can be effectively absorbed by the absorption member 200 in the absorbing chamber 13.

In another embodiment, the liquid ejecting head 100 including the plurality of vibrating portions 30 for one nozzle substrate 20, as in the fifth embodiment and the sixth embodiment, is configured to circulate liquid, as in the third embodiment.

G. Seventh Embodiment

FIG. 11 is a cross-sectional view of a liquid ejecting head 100g according to a seventh embodiment. In this embodiment, each vibrating portion 30g includes only one absorbing chamber 13, unlike the sixth embodiment. Of the configuration of a liquid ejecting apparatus 300 and the liquid ejecting head 100e of the seventh embodiment, part that is not described in particular is the same as that of the sixth embodiment.

In this embodiment, the absorbing chambers 13 are each disposed only in a pressure chamber 12 close to the central plane O in the Y direction, in each of the two vibrating portions 30g, next to each other in the Y direction. In other words, the two absorbing chambers 13 are disposed next to only two inner pressure chambers 12 in the Y direction of the four pressure chambers 12 of the liquid ejecting head 100g, and are not next to the other two pressure chambers 12 of the liquid ejecting head 100g in the Y direction.

In this embodiment, two vibration absorbing mechanisms 70 that absorb liquid are provided for the outer pressure chambers 12 of the liquid ejecting head 100g in the Y direction. Each vibration absorbing mechanism 70 includes a space 71 passing through a communication plate 15g in the Z direction and an absorption plate 75. The absorption plate 75 includes a flexible portion 76 and a fixed portion 77 that supports the flexible portion 76. The flexible portion 76 seals the space 71 from the −Z direction. The flexible portion 76 is a thin film made of, for example, polyphenylene sulfide (PPS) or aromatic polyamide, and is fixed to the communication plate 15g with an adhesive or the like. The fixed portion 77 is a thin sheet made of stainless steel or the like and is fixed to the flexible portion 76 with an adhesive or the like to support the flexible portion 76. The vibration absorbing mechanism 70 absorbs the vibration of liquid propagated from the pressure chamber 12 with the absorption plate 75 in the space 71.

A nozzle substrate 20g of this embodiment has four rows of nozzles 21, like the nozzle substrate 20e of the fifth embodiment and the sixth embodiment. The nozzle substrate 20g has such a size that the absorption plate 75, described above, can be provided at positions in the +Y direction and the −Y direction.

Disposing the vibration absorbing mechanisms 70 at the outside of the liquid ejecting head 100g in the Y direction, as in this embodiment, is easier than disposing the vibration absorbing mechanisms 70 at the inside of the liquid ejecting head 100g in the Y direction. Thus, even if many three or more nozzle rows are provided in one nozzle substrate 20g, and channels corresponding to the many nozzle rows are provided in the case member 40g and so on, as in this embodiment, the nozzle substrate 20g and the case member 40g can easily be manufactured and can be reduced in size.

The vibration of the liquid propagated from the pressure chamber 12 disposed at the inner side of the liquid ejecting head 100g in the Y direction is absorbed by the absorption member 200 provided on the opposite side in the first direction with respect to the absorbing chamber 13. Since the absorption member 200 is made of at least part of the components of the actuator 150, as in the first embodiment, the kind of the material for the components of the liquid ejecting head 100g can be reduced as compared with a case in which the vibration absorbing mechanism 70 is provided for all of the four pressure chambers 12, and the process for manufacturing the liquid ejecting head 100g can be simplified.

The absorption member 200 of the liquid ejecting head 100g of the seventh embodiment described above can also be easily manufactured with components of the actuator 150, and the vibration of the liquid can be effectively absorbed by the absorption member 200 in the absorbing chamber 13.

H. Eighth Embodiment

The absorption member 200 of the first embodiment is composed of the vibration plate member 205 which is a member constituting the vibration plate 155, a first electrode member 215 which is a member constituting the first electrode 165, and a member constituting the piezoelectric substance 175. It is composed of a certain piezoelectric member 225. On the other hand, in the eighth embodiment, the absorption member 200 is composed only of the vibration plate member 205, which is a member constituting the vibration plate 155.

Further, in the first embodiment, the vibration plate 155 includes a flexible layer 156 formed on the first substrate 10 and containing silicon, and a protective layer 157 formed on the flexible layer 156 and containing zirconium. However, a reinforcing layer may be further included on the protective layer 157.

For example, a film formed of gold may be provided as a reinforcing layer. Since gold has a small Young's modulus and is easily deformed, it can be reinforced without significantly reducing the amount of deformation of the absorption member 200.

Further, for example, a film formed of titanium may be provided as a reinforcing layer. Since titanium has a high tensile strength, the strength of the absorption member 200 can be greatly improved.

Further, as the reinforcing layer, a film formed of iridium, a film formed of platinum, a film formed of nickel chromium, or a film formed of an epoxy resin may be provided.

Further, the reinforcing layer may be provided on both the portion of the vibration plate member 205 corresponding to the absorption member 200 and the portion corresponding to the actuator 150, or is provided only on the portion corresponding to the absorption member 200.

Further, the reinforcing layer may be uniformly provided over the entire area of the absorption member 200, or may be provided only at a specific portion of the absorption member 200. For example, a reinforcing layer may be provided so as to surround each of the plurality of absorption chambers 13. For example, a reinforcing layer may be provided so as to surround each of the plurality of absorption chambers 13 other than the nozzle side along the Y-axis direction. For example, a reinforcing layer may be provided so as to surround a part of the periphery of the plurality of absorption chambers 13 and continuously without branching over the plurality of absorption chambers 13.

H. Other Embodiments (H-1) In the above embodiments, the recess 33 includes the first recess 34 and the second recess 35. Alternatively, the recess 33 may be one recess. In this case, the actuator 150 and the absorption member 200 may be disposed in the opening of the one recess. Alternatively, the recess 33 may include three or more recesses.

(H-2) In the above embodiments, the depth of the opening of the first recess 34 and the depth of the opening of the second recess 35 are equal. Alternatively, the depth of the opening of the first recess 34 and the depth of the opening of the second recess 35 may differ.

(H-3) In the above embodiments, the second recess 35 communicates with the outside. Alternatively, the second recess 35 does not need to communicate with the outside.

(H-4) In the above embodiments, the pressure chamber 12 is provided for each of the plurality of nozzles 21, and the absorbing chamber 13 is provided in common to the plurality of nozzles 21. Alternatively, the pressure chamber 12 does not need to be provided for each of the plurality of nozzles 21, and the absorbing chamber 13 does not need to be provided in common to the plurality of nozzles 21. For example, the absorbing chamber 13 may be provided for each of the plurality of nozzles 21.

(H-5) In the above embodiments, the length W1 in the third direction of the actuator 150 corresponding to one pressure chamber 12 is smaller than the length W2 in the third direction of the absorption member 200 corresponding to one absorbing chamber 13. Alternatively, the length W1 may be larger than the length W2, or the length W1 may be equal to the length W2.

(H-6) In the above embodiments, the length L1 of the pressure chamber 12 in the second direction is larger than the length L2 of the absorbing chamber in the second direction. Alternatively, the length L1 may be smaller than the length L2, or the length L1 may be equal to the length L2.

I. Other Forms

It is to be understood that the present disclosure is not limited to the above embodiments and may be embodied in various forms without departing from the spirit thereof. For example, the present disclosure may also be embodied in the forms described below. The technical features of the above embodiments corresponding to the forms described below may be replaced or combined as appropriate to solve part or all of the problems of the present disclosure or to achieve part or all of the advantageous effects of the present disclosure. The technical features may be deleted as appropriate if not described as essential features in this specification.

(1) According to a first aspect of the present disclosure, a liquid ejecting head is provided. The liquid ejecting head includes a nozzle that ejects liquid, an actuator including a piezoelectric element and a vibration plate that is vibrated by driving of the piezoelectric element, a pressure chamber in which the liquid flows and in which a pressure is applied to the liquid by vibration of the vibration plate, an absorbing chamber in the liquid flows, the absorbing chamber absorbing the vibration of the liquid propagated from the pressure chamber, and an absorption member. In this liquid ejecting head, the pressure chamber extends in a second direction crossing a first direction, the first direction being a direction from the pressure chamber to the nozzle. The pressure chamber and the absorbing chamber are disposed at a same position in the first direction and next to each other in the second direction. The actuator is disposed on an opposite side in the first direction with respect to the pressure chamber. The absorption member is disposed on the opposite side with respect to the absorbing chamber, the absorption member including at least part of members constituting the actuator. This configuration makes it easy to manufacture the absorption member with components of the actuators and allows the vibration of the liquid to be efficiently absorbed by the absorption member in the absorbing chamber.

(2) In the liquid ejecting head according to the first aspect, the piezoelectric element may include a first electrode, a second electrode disposed nearer to the pressure chamber than the first electrode in the first direction, a piezoelectric substance disposed between the first electrode and the second electrode, and a wiring portion electrically coupled to the first electrode or the second electrode, wherein the absorption member may constitute the wiring portion. This configuration allows forming the absorption member with the member constituting the wiring portion.

(3) In the liquid ejecting head according to the first aspect, the wiring portion may contain at least gold. This configuration increases the conductivity of the wiring portion and also the flexibility of the wiring portion, thereby enhancing the durability of the wiring portion. Furthermore, since the absorption member contains gold as the wiring portion does, the flexibility of the absorption member is increased, and the durability of the absorption member is enhanced.

(4) The liquid ejecting head according to the first aspect may further include a first substrate in which the pressure chamber and the absorbing chamber are formed, and a second substrate laid on the first substrate and including a recess, wherein the recess may be open facing the pressure chamber and the absorbing chamber on the opposite side with respect to the pressure chamber and the absorbing chamber. This configuration allows the actuator and the absorption member to be protected by the recess.

(5) In the liquid ejecting head according to the first aspect, the liquid does not need to flow in the recess.

(6) In the liquid ejecting head according to the first aspect, the recess may include a first recess and a second recess arranged beside the first recess in the second direction, wherein the first recess may be open facing the pressure chamber, and the second recess may be open facing the absorbing chamber. This configuration allows the actuator to be protected by the first recess, and the absorption member to be protected by the second recess and increases the strength of the second substrate as compared with a case in which the recess includes only one recess.

(7) In the liquid ejecting head according to the first aspect, the first recess and the second recess may be equally open in depth.

(8) In the liquid ejecting head according to the first aspect, the first recess may be provided with the actuator, and the second recess may be provided with the absorption member.

(9) In the liquid ejecting head according to the first aspect, the second recess may communicate with outside. This configuration allows the pressure in the second recess to be kept at the atmospheric pressure with the simple configuration.

(10) The liquid ejecting head according to the first aspect may further include a common liquid chamber portion that reserves, in common, the liquid to be supplied to a plurality of the nozzles.

(11) The liquid ejecting head according to the first aspect may further include a first communication channel that communicate between the pressure chamber and the nozzle and a second communication channel that communicates between the absorbing chamber and the common liquid chamber portion.

(12) In the liquid ejecting head according to the first aspect, the first communication channel may communicate with an inner wall of the pressure chamber on a forward side in the first direction, and the second communication channel may communicate with an inner wall of the absorbing chamber on the forward side.

(13) In the liquid ejecting head according to the first aspect, the pressure chamber may be provided individually for a plurality of the nozzles, and the absorbing chamber may be provided in common to the plurality of nozzles. This configuration allows the pressure chambers corresponding to the nozzles to individually apply pressure to the liquid and also allows the absorbing chamber common to the plurality of nozzles to absorb the vibration of the liquid propagated from the pressure chambers.

(14) In the liquid ejecting head according to the first aspect, a plurality of the nozzles may be arranged in a third direction crossing the first direction and the second direction, and the actuator corresponding to the one pressure chamber may be shorter in the third direction than the absorption member corresponding to the one absorbing chamber in the third direction. This configuration makes it easy to provide sufficient flexibility to the absorption member as compared with a case in which the length of the actuator corresponding to one pressure chamber in the third direction is larger than the length of the absorption member corresponding to one absorbing chamber in the third direction or a case in which the lengths are equal. This allows the absorption member to effectively absorb the vibration of the liquid propagated from the pressure chambers to the absorbing chamber.

(15) In the liquid ejecting head according to the first aspect, the pressure chamber may be longer in the second direction than the absorbing chamber in the second direction. This configuration can increase the capacity of the pressure chamber as compared with a case in which the length of the pressure chamber in the second direction is smaller than the length of the absorbing chamber in the second direction or a case in which the lengths are equal. This allows effectively applying pressure to the liquid in the pressure chamber.

(16) In the liquid ejecting head according to the first aspect, a plurality of the pressure chambers may be provided for the one nozzle. With this configuration, even if a plurality of pressure chambers are provided for each nozzle, the absorption member can easily be manufactured, and the vibration of the liquid can be effectively absorbed in the absorbing chamber using the absorption member.

(17) According to a second aspect of the present disclosure, a liquid ejecting apparatus is provided. The liquid ejecting apparatus includes the liquid ejecting head according to the first aspect and a control unit that controls an ejecting operation from the liquid ejecting head. This configuration makes it easy to manufacture the absorption member with components of the actuators and allows the vibration of the liquid to be efficiently absorbed by the absorption member in the absorbing chamber.

The present disclosure can be implemented not only in the forms of the liquid ejecting head and the liquid ejecting apparatus describe above but also in various forms, such as liquid ejecting systems and multifunctional apparatuses including a liquid ejecting apparatus.

What is claimed is:

1. A liquid ejecting head comprising:
    a nozzle that ejects liquid;
    an actuator including a piezoelectric element and a vibration plate that is vibrated by driving of the piezoelectric element;
    a pressure chamber in which the liquid flows and in which a pressure is applied to the liquid by vibration of the vibration plate;
    an absorbing chamber in the liquid flows, the absorbing chamber absorbing the vibration of the liquid propagated from the pressure chamber;
    and
    an absorption member, wherein
    the pressure chamber extends in a second direction crossing a first direction, the first direction being a direction from the pressure chamber to the nozzle,
    the pressure chamber and the absorbing chamber are disposed at a same position in the first direction and next to each other in the second direction,
    the actuator is disposed on an opposite side in the first direction with respect to the pressure chamber, and
    the absorption member is disposed on the opposite side with respect to the absorbing chamber, the absorption member including at least part of members constituting the actuator.

2. The liquid ejecting head according to claim 1, wherein the piezoelectric element includes:
    a first electrode;
    a second electrode disposed nearer to the pressure chamber than the first electrode in the first direction;
    a piezoelectric substance disposed between the first electrode and the second electrode; and
    a wiring portion electrically coupled to the first electrode or the second electrode, and wherein
    the absorption member constitutes the wiring portion.

3. The liquid ejecting head according to claim 2, wherein the wiring portion contains at least gold.

4. The liquid ejecting head according to claim 1, wherein the absorption member includes a member that consists the vibration plate.

5. The liquid ejecting head according to claim 4, wherein the member that consists the vibration plate includes a flexible layer containing silicon, and a protective layer formed on the flexible layer and containing zirconium.

6. The liquid ejecting head according to claim 4, wherein the member that consists the vibration plate includes a reinforcing layer containing at least any one of gold, titanium, iridium, platinum, nickel chromium, and epoxy resin.

7. The liquid ejecting head according to claim 1, further comprising:
    a first substrate in which the pressure chamber and the absorbing chamber are formed; and
    a second substrate laid on the first substrate and including a recess, wherein
    the recess is open facing the pressure chamber and the absorbing chamber on the opposite side with respect to the pressure chamber and the absorbing chamber.

8. The liquid ejecting head according to claim 7, wherein the liquid does not flow in the recess.

9. The liquid ejecting head according to claim 7, wherein
    the recess includes a first recess and a second recess arranged beside the first recess in the second direction, and wherein
    the first recess is open facing the pressure chamber, and the second recess is open facing the absorbing chamber.

10. The liquid ejecting head according to claim 9, wherein the first recess and the second recess are equally open in depth.

11. The liquid ejecting head according to claim 9, wherein the first recess is provided with the actuator, and wherein the second recess is provided with the absorption member.

12. The liquid ejecting head according to claim 9, wherein the second recess communicates with outside.

13. The liquid ejecting head according to claim 1, further comprising a common liquid chamber portion that reserves, in common, the liquid to be supplied to a plurality of the nozzles.

14. The liquid ejecting head according to claim 13, further comprising:
    a first communication channel that communicate between the pressure chamber and the nozzle; and
    a second communication channel that communicates between the absorbing chamber and the common liquid chamber portion.

15. The liquid ejecting head according to claim 14, wherein
    the first communication channel communicates with an inner wall of the pressure chamber on a forward side in the first direction, and wherein
    the second communication channel communicates with an inner wall of the absorbing chamber on the forward side.

16. The liquid ejecting head according to claim 1, wherein
the pressure chamber is provided individually for a plurality of the nozzles, and wherein
the absorbing chamber is provided in common to the plurality of nozzles.

17. The liquid ejecting head according to claim 1, wherein
a plurality of the nozzles is arranged in a third direction crossing the first direction and the second direction, and wherein
the actuator corresponding to the one pressure chamber is shorter in the third direction than the absorption member corresponding to the one absorbing chamber in the third direction.

18. The liquid ejecting head according to claim 1, wherein the pressure chamber is longer in the second direction than the absorbing chamber in the second direction.

19. The liquid ejecting head according to claim 1, a plurality of the pressure chambers is provided for the one nozzle.

20. A liquid ejecting apparatus comprising:
the liquid ejecting head according to claim 1; and
a control unit that controls an ejecting operation from the liquid ejecting head.

* * * * *